US007576372B2

(12) United States Patent
Maruska et al.

(10) Patent No.: US 7,576,372 B2
(45) Date of Patent: Aug. 18, 2009

(54) METHOD FOR MAKING FREE-STANDING ALGAN WAFER, WAFER PRODUCED THEREBY, AND ASSOCIATED METHODS AND DEVICES USING THE WAFER

(75) Inventors: Herbert Paul Maruska, Winter Springs, FL (US); John Joseph Gallagher, Winter Park, FL (US); Mitch M. C. Chou, Sanford, FL (US); David W. Hill, Orlando, FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 126 days.

(21) Appl. No.: 11/627,712

(22) Filed: Jan. 26, 2007

(65) Prior Publication Data

US 2007/0114566 A1 May 24, 2007

Related U.S. Application Data

(60) Division of application No. 10/396,986, filed on Mar. 25, 2003, now Pat. No. 7,169,227, which is a continuation-in-part of application No. 09/920,448, filed on Aug. 1, 2001, now Pat. No. 6,648,966.

(51) Int. Cl.
*H01L 31/072* (2006.01)
*H01L 31/109* (2006.01)
*H01L 31/0328* (2006.01)
*H01L 31/0336* (2006.01)

(52) U.S. Cl. .................. 257/190; 257/183; 257/200; 117/89; 117/94

(58) Field of Classification Search ................. 257/183, 257/190, 200, 201; 117/89, 94, 95, 910
See application file for complete search history.

(56) References Cited

U.S. PATENT DOCUMENTS 5,563,428 A 10/1996 Ek et al. .................... 257/77

(Continued)

FOREIGN PATENT DOCUMENTS

WO 01/35447 5/2001

OTHER PUBLICATIONS

Naniwae et al., *Journal of Crystal Growth*, "Growth of Single Crystal GaN Substrate Using Hydride Vapor Phase Epitaxy", vol. 99 (1990), pp. 381-384

(Continued)

*Primary Examiner*—Phuc T Dang
(74) *Attorney, Agent, or Firm*—Allen, Dyer, Doppelt, Milbrath & Gilchrist, P.A.

(57) ABSTRACT

A method for making a free-standing, single crystal, aluminum gallium nitride (AlGaN) wafer includes forming a single crystal AlGaN layer directly on a single crystal $LiAlO_2$ substrate using an aluminum halide reactant gas, a gallium halide reactant gas, and removing the single crystal $LiAlO_2$ substrate from the single crystal AlGaN layer to make the free-standing, single crystal AlGaN wafer. Forming the single crystal AlGaN layer may comprise depositing AlGaN by vapor phase epitaxy (VPE) using aluminum and gallium halide reactant gases and a nitrogen-containing reactant gas. The growth of the AlGaN layer using VPE provides commercially acceptable rapid growth rates. In addition, the AlGaN layer can be devoid of carbon throughout. Because the AlGaN layer produced is high quality single crystal, it may have a defect density of less than about $10^7 cm^{-2}$.

6 Claims, 4 Drawing Sheets

U.S. PATENT DOCUMENTS

| | | | |
|---|---|---|---|
| 5,625,202 A | 4/1997 | Chai | 257/94 |
| 5,679,152 A | 10/1997 | Tischler et al. | 117/97 |
| 5,874,747 A | 2/1999 | Redwing et al. | 257/77 |
| 5,915,194 A * | 6/1999 | Powell et al. | 438/478 |
| 6,086,673 A | 7/2000 | Molnar | 117/90 |
| 6,139,628 A | 10/2000 | Yuri et al. | 117/89 |
| 6,146,457 A | 11/2000 | Solomon | 117/90 |
| 6,146,458 A | 11/2000 | Hooper et al. | 117/106 |
| 6,156,581 A | 12/2000 | Vaudo et al. | 438/22 |
| 6,218,280 B1 | 4/2001 | Kryliouk et al. | 438/607 |
| 6,252,261 B1 | 6/2001 | Usui et al. | 257/190 |
| 6,271,104 B1 | 8/2001 | Razeghi et al. | 438/481 |
| 6,303,405 B1 | 10/2001 | Yoshida et al. | 438/46 |
| 6,350,666 B2 * | 2/2002 | Kryliouk | 438/604 |
| 6,380,108 B1 | 4/2002 | Linthicum et al. | 438/791 |
| 6,498,113 B1 | 12/2002 | Solomon et al. | 438/778 |
| 6,534,795 B2 | 3/2003 | Hori et al. | 257/79 |
| 6,648,966 B2 * | 11/2003 | Maruska et al. | 117/101 |

OTHER PUBLICATIONS

Hellman et al., *MRS Internet Journal of Nitride Semiconductor Research,* "Epitaxial Growth and Orientation of GaN on (100) g-LiAlO₂", vol. 2, Article 30 (Sep. 15, 1997).

Xu Kee et al., *Journal of Crystal Growth,* "y-LiAlO₂ Single Crystal: A Novel Substrate for Gan Epitaxy", vol. 193 (Apr. 27, 1998) pp. 127-132.

Ke Xu et al., *Phys. Stat. Sol.,* "MOCVD Growth of GaN on LiAlO₂ (100) Substrates", (Jul. 4, 1999) pp. 589-593.

Waltereit et al., *Phys. Stat Sol.,* "Growth of M- Plane GaN (1100): A way to Evade Electrical Polarization in Nitrides", (Mar. 6, 2000) pp. 133-138.

Waltereit et al., *Nature,* "Nitride Semiconductors Free of Electrostatic Fields for Efficient White Light-Emitting Diodes", vol. 406 (Aug. 24, 2000) pp. 865-868.

P. Waltereit et al., *Journal of Crystal Growth,* "Growth of M-plane GaN (1100) on y-LiAlO₂ (100)", pp. 143-147, (2000).

Kryliouk et al., *Phys. Stat. Sol (a)* 176.407 (1999) "GaN Substrates: Growth and Characterization", Jul. 4, 1999, pp. 407-410.

Deschler et al., *Journal of Crystal Growth,* "Halogen VPE of AiGaAs For Optoelectronic Device Applications", vol. 82 (1987) pp. 628-638.

Sasaki et al., *Journal of Applied Physics,* "Substrate-Orientation Dependence of GaN Single-Crystal Films Grown by Metalorganic Vapor-Phase Epitaxy", vol. 61, No. 7, (Apr. 1, 1987) pp. 2533-2540.

Kuokstis et al., *Applied Physics Letters,* "Polarization Effects in Photoluminescence of C-and m-plane GaN/A1GaN Multiple Quantum Wells", vol. 81, No. 22, Nov. 25, 2002, pp. 4130-4132.

Maruska et al., *Applied Physics Letters,* "The Preparation and Properties of Vapor-Deposited Single-Crystal-Line GaN", vol. 15, No. 10 (Nov. 15, 1969) pp. 327-329.

Safvi et al., *Mat. Res. Soc. Symp. Proc.,* "Optimization of Reactor Geometry and Growth Conditions for GaN Halide Vapor Phase Epitaxy", vol. 423 (1996) pp. 226-244.

Sun et al., *Applied Physics Letters,* "Comparison of the Physical Properties of GaN Thin Film Deposited on (0001) and (0112) Sapphire Substrates", vol. 63, No. 7 (Aug. 16, 1993) pp. 973-975.

Jin Seo Im et al., *Mat. Res. Soc. Symp. Proc.,* "Effects of Piezoelectric Fields in GaInN/AiGaN Heterostructures and Quantum Wells", vol. 482 (1998) pp. 513-518.

Chen et al., *American Institute of Physics,* "GaN Homoepitaxy on Freestanding (1100) Oriented GzN Substrates", vol. 81, No. 17 (Oct. 21, 2002), pp. 3194-3196.

* cited by examiner

METHOD FOR MAKING FREE-STANDING ALGAN WAFER, WAFER PRODUCED THEREBY, AND ASSOCIATED METHODS AND DEVICES USING THE WAFER

RELATED APPLICATION

This application is a divisional application of Ser. No. 10/396,986 filed on Mar. 25, 2003, now U.S. Pat. No. 7,169,227 which is a continuation-in-part of patent application Ser. No. 09/920,448, filed Aug. 1, 2001, now U.S. Pat. No. 6,648,966, the disclosures of which are hereby incorporated by reference in their entirety.

FIELD OF THE INVENTION

The invention relates to the field of semiconductors, and, more particularly, to methods for making single crystal wafers and the wafers produced thereby.

BACKGROUND OF THE INVENTION

Ultraviolet (UV) lasers and light-emitting diodes are increasingly being used advantageously with a number of different devices in a number of different fields. UV laser diodes may provide, for example, much higher storage densities on DVD disks. UV light-emitting diodes, for example, may be used to stimulate commercial phosphors to produce solid-state lighting that one day could possibly replace incandescent and fluorescent lamps. These and other such devices typically will require an emitter (e.g., nitride UV emitter) for which a transparent substrate is a vital component.

It is well known to those skilled in the art that if an LED structure is grown on an opaque substrate which is capable of absorbing the emitted light, then the half of the generated light which is emitted into the substrate will be lost by absorption in the substrate. However, if a substrate is transparent, then the LED can be outfitted with a mirror located below the substrate which serves to back-reflect this light, which then again passes through the substrate back up to the top surface, thus doubling the light output. For example, AlN is transparent out to 200 nm, while GaN is only transparent out to 365 nm. Fortunately, AlN and GaN are mutually soluble in all proportions, and thus alloys of the form $Al_xGa_{1-x}N$ can be formed which possess absorption edges between 365 and 200 nm in the UV. Thus an AlGaN substrate can be tailored by varying the Al/Ga ratio to be transparent out to any desired wavelength in order not to absorb the emitted UV light from a particular UNV-emitting LED device. Such a transparent AlGaN substrate will yield nitride based UV-emitting LEDs with twice the brightness, compared with one grown on an opaque GaN substrate.

Persistent problems in the nitride semiconductor area, however, have hampered production of UV light-emitting devices using such semiconductors. For example, although a sapphire substrate is transparent at all or most wavelengths of interest, it provides a poor lattice match to nitrides. Even though a free-standing GaN layer may solve the lattice mismatch problem, it typically absorbs light below 365 nm. Nitride layers with high aluminum concentrations grown on sapphire tend to crack, and carborundum (SiC) is totally absorbing at wavelengths in the UV wavelength range.

U.S. Pat. No. 5,625,202 to Chai discloses growing nitride compound semiconductor films (e.g., GaN) on various substrate materials described as modified wurtzite structure oxide compounds. These include Lithium Aluminum Oxide, Sodium Aluminum Oxide, Lithium Gallium Oxide, Sodium Gallium Oxide, Lithium Germanium Oxide, Sodium Germanium Oxide, Lithium Silicon Oxide, Silicon Oxide, Lithium Phosphor Oxide, Lithium Arsenic Oxide, Lithium Vanadium Oxide, Lithium Magnesium Germanium Oxide, Lithium Zinc Germanium Oxide, Lithium Cadmium Germanium Oxide, Lithium Magnesium Silicon Oxide, Lithium Zinc Silicon Oxide, Lithium Cadmium Silicon Oxide, Sodium Magnesium Germanium Oxide, Sodium Zinc Germanium Oxide, and Sodium Zinc Silicon Oxide. The GaN layer remains on the growth substrate.

The Chai '202 patent in particular discloses forming, for example, a UV light emitting diode (LED) comprising an n-type GaN layer that is directly on a $LiGaO_2$ substrate. In the context of deposition techniques for forming the $Ga_{1-x}Al_xN$ on the substrate, the Chai '202 patent briefly mentions molecular beam epitaxy (MBE) and metal-organic chemical vapor deposition (MOCVD).

U.S. Pat. No. 6,156,581 to Vaudo et al. discloses growing one of a gallium, aluminum, or indium (Ga, Al, In) nitride layer on a substrate for subsequent fabrication using metalorganic chemical vapor deposition (MOCVD) or molecular beam epitaxy (MBE). Vapor-phase (Ga, Al, In) chloride is reacted with a vapor-phase nitrogenous compound in the presence of a substrate to form (Ga, Al, In) nitride. The thickness of the base layer is described as being on the order of 2 microns and greater, and the defect density may be on the order of $10^8$ cm$^{-2}$ or lower.

The Vaudo et al. '581 patent provides a laundry list of proposed foreign substrates including sapphire, silicon, silicon carbide, diamond, lithium gallate, lithium aluminate, zinc oxide, spinel, magnesium oxide, ScAlMgO4, gallium arsenide, silicon-on-insulator, carbonized silicon-on-insulator, carbonized silicon-on-silicon, gallium nitride, etc., including conductive as well as insulating and semi-insulating substrates, twist-bonded substrates (i.e., where the substrate of crystalline material is bonded to another single crystal substrate material with a finite angular crystallographic misalignment), and compliant substrates of a type disclosed in U.S. Pat. No. 5,563,428 to Ek et al. The patent further discloses that in some embodiments, the substrate can be removed to leave a free-standing wafer. The patent provides specific growth information, though, only for sapphire.

U.S. Pat. No. 6,252,261 to Usui et al. discloses a method and device for producing large-area single crystalline III-V nitrides on an oxide substrate. The large-area single crystalline III-V nitrides are generally denoted by $Al_xIn_yGa_{1-x-y}N$, with x and y ranging from 0 to 1, and x+y being greater than or equal to zero and less than or equal to one. The crystalline nitride is expressly described as being grown on a sapphire substrate ($Al_2O_3$).

U.S. Pat. No. 6,218,280 B1 to Kryliouk et al. discloses forming a nitrided layer on a lithium gallate substrate, forming a first GaN layer on the nitrided layer by metalorganic chemical vapor deposition (MOCVD), growing a next GaN portion using halide vapor phase epitaxy, and growing a capping GaN layer again using MOCVD. The GaN layers may then be separated from the substrate. The patent lists a number of other proposed substrates in addition to the specifically disclosed lithium gallate. These other substrates include $LiAlO_2$, $MgAlScO_4$, $Al2MgO_4$ and $LiNdO_2$. Unfortunately, the use of MOCVD results in carbon being incorporated into the GaN wafer. This carbon may be undesirable for many applications where pure GaN is desired.

U.S. Pat. No. 6,086,673 to Molnar discloses using hydride vapor phase epitaxy to produce a nitride layer on a substrate. Defined as a growth substrate, the substrate is expressly described as preferably being sapphire.

U.S. Pat. No. 6,146,458 to Hooper et al. discloses forming a group III nitride on a substrate using molecular beam epitaxy (MBE). The representative group III nitrides listed are GaN, InN, and AlN, as well as their alloys. The substrate is described as including $LiAlO_2$.

U.S. Pat. No. 6,874,747 to Redwing et al. and U.S. Pat. No. 5,679,152 to Tischler et al. each discloses green-blue to UV light emitting semiconductor lasers comprising n-type and p-type nitride layers on a substrate. The nitride layers may include AlGaN, while the substrate is expressly described as being silicon, silicon carbide, gallium arsenide, or sapphire. Tischler et al. expressly states that silicon and silicon carbide are preferred.

An article by Naniwae et al. entitled "Growth of Single Crystal GaN substrate Using Hydride Vapor Phase Epitaxy" in Jnl of Crystal Growth, Vol. 99, 1990, pp. 381-384, discloses growth of GaN films on a sapphire substrate. A pretreatment of gallium and HCl without ammonia for 10-20 minutes at 1030° C. is used to pretreat the sapphire surface prior to metalorganic vapor phase epitaxy (MOVPE) of the GaN film. An article titled "Epitaxial Growth and Orientation of GaN on (1 0 0) g-$LiAlO_2$" by Hellmen, et al. explains the lattice matching property of $LiAlO_2$.

An article by Xu et al. entitled "$\gamma$-$LiAlO_2$ single crystal: a novel substrate for GaN epitaxy" in the Journal of Crystal Growth, Vol. 193, 1998, pp. 127-132, discloses $LiAlO_2$ as a substrate for GaN film growth. The substrates were pretreated with ammonia, and thereafter the GaN film was grown using metalorganic chemical vapor deposition, Another article by Xu et al. entitled "MOCVD Growth of GaN on $LiAlO_2$ Substrates" in Phys. Stat. Sol, (a) Vol. 176 (1999), pp. 589-593 also discloses an $LiAlO_2$ substrate, an ammonia pretreatment, and MOCVD to form the GaN layer. Unfortunately, the MOCVD process may not be sufficiently fast to produce thicker films. In addition, the precursor gas for deposition is trimethylgallium which results in carbon being undesirably incorporated into the GaN layer.

An article by Waltereit et al. entitled "Nitride semiconductors free of electrostatic fields for efficient white light-emitting diodes" in Letters to Nature, Vol. 406, Aug. 24, 2000, pp. 865-868, discloses the epitaxial growth of a thin layer of M-plane GaN on $\gamma$-$LiAlO_2$ using plasma-assisted molecular beam epitaxy. The exposed surface of the thin GaN layer may be bonded to another substrate, and the $LiAlO_2$ layer may then be selectively removed to form certain types of higher efficiency devices.

An article also by Waltereit et al. entitled "Growth of M-Plane GaN(1$\bar{1}$00) A Way to Evade Electrical Polarization in Nitrides" in Phys. Stat. Sol. (a) Vol. 180 (2000) pp. 133-138, similarly discloses the formation of an M-plane GaN layer on $LiAlO_2$ substrate. The thin GaN layer (1.5 µm sample) is grown using molecular beam epitaxy at a relatively slow growth rate of 0.5 µm/h. The article reports that M-plane GaN is free of electrical polarization, as compared to more convention C-plane GaN, and that this leads to improved electron-hole wavefunction overlap and therefore improved quantum efficiencies. The M-plane GaN quantum wells have a dramatic improvement in room-temperature quantum efficiency, and the authors surmise that if contributions from competing non-radiative recombination channels are equal for M-plane and C-plane wells, then M-plane GaN opens the way for highly efficient ultraviolet emission, Despite continuing developments in the area of GaN film growth, what would still be desired is an efficient approach to produce free-standing, high quality, single crystal, AlGaN wafers that are transparent to light in the UV range.

SUMMARY OF THE INVENTION

In view of the foregoing background, it is therefore an object of the present invention to provide a method for making high-quality, free-standing, single crystal AlGaN wafers that are transparent in the UV range for use in electronic devices.

This and other objects, features and advantages in accordance with the present invention are provided by a method for making a free-standing, single crystal, AlGaN wafer comprising forming a single crystal AlGaN layer directly on a single crystal $LiAlO_2$ substrate using aluminum and gallium halide reactant gases, and removing the single crystal $LiAlO_2$ substrate from the single crystal AlGaN layer to make the free-standing, single crystal AlGaN wafer. Thus, the present invention extends the invention disclosed in the parent application, which is directed to making a free-standing, single crystal GaN wafer. The resulting free-standing, single crystal AlGaN wafer of the present invention provides a high quality, low defect density nitride substrate upon which may be grown by homoepitaxy device structures (e.g., light-emitting and laser diodes) with improved operating characteristics, which include delivery of high power at very short wavelengths (e.g., in the UV range).

Forming the single crystal AlGaN layer may comprise depositing AlGaN by vapor phase epitaxy (VPE) using the aluminum and gallium halide reactant gases as well as a nitrogen-containing reactant gas. For example, the aluminum halide reactant gas may comprise aluminum chloride, the gallium halide reactant gas may comprise gallium chloride, and the nitrogen-containing reactant gas may comprise ammonia.

Because the aluminum and gallium halides are used as reactant gases instead of a metal organic reactant, such as trimethygallium (TMG), the growth of the AlGaN layer can be performed using VPE, which provides commercially acceptable rapid growth rates. In addition, the AlGaN layer is also devoid of carbon throughout. Because the AlGaN layer produced is high quality single crystal, it may have a defect density of less than about $10^7 cm^{-2}$. Its major surface opposite the $LiAlO_2$ substrate is also relatively smooth, such as having a surface roughness of less than about 5 nm RMS. Accordingly, the upper surface does not need a smoothing capping layer, such as also typically formed using a metal organic, such as TMG. Considered in somewhat different terms, the method may be considered as forming a single crystal AlGaN layer devoid of carbon directly on the single crystal $LiAlO_2$ substrate.

Another aspect of the invention relates to pretreating the single crystal $LiAlO_2$ substrate prior to depositing AlGaN, which may enhance the quality of the AlGaN single crystal layer. More particularly, the pretreating may use the gallium halide reactant gas without the nitrogen-containing reactant gas. The pretreating may be performed for a time sufficient to form a monolayer of gallium on the single crystal $LiAlO_2$ substrate. The pretreating and depositing may also be performed in the same chamber. Of course, the $LiAlO_2$ substrate may be cleaned prior to forming the AlGaN layer.

The method may be advantageously used to produce a (1$\bar{1}$00)-oriented AlGaN wafer. Such a wafer offers advantages in terms of efficiency and producing UV spectrum light emitting devices. The (1$\bar{1}$00)-oriented AlGaN layer may be grown by using (100)-oriented tetragonal ($\gamma$) $LiAlO_2$ as the starting substrate material.

An advantage of the $LiAlO_2$ substrate is that it may be considered a compliant substrate, unlike sapphire, for example, that tends to cause wafers to take a bowed shape.

Moreover, the method may include forming the AlGaN layer at an elevated temperature, and with the LiAlO$_2$ substrate and the AlGaN layer having relative thicknesses so that the LiAlO$_2$ substrate develops cracks therein upon cooling from the elevated temperature. These cracks may be advantageous for a subsequent wet etching step to remove the LiAlO$_2$ substrate. The wet etching may comprise wet etching using hydrochloric acid at a temperature above room temperature.

The method may include the use of an LiAlO$_2$ substrate having a diameter of 50 mm or greater so that the single crystal AlGaN wafers have a corresponding relatively large diameter. The AlGaN layer may also be grown to have a thickness of greater than about 100 µm.

Another aspect of the invention relates to a free-standing, single crystal AlGaN wafer having characteristics different than prior art GaN wafers. More particularly, the AlGaN wafer may comprise (1$\bar{1}$00)-oriented, single crystal AlGaN which is devoid of carbon throughout, and which has a defect density of less than about $10^7$ cm$^{-2}$. In addition, a major surface may have a relatively smooth surface with a surface roughness of less than about 5 nm RMS. The free-standing AlGaN wafer may have a diameter of greater than about 50 mm, and a thickness of greater than about 100 microns.

Another aspect of the invention relates to a method for making an electronic device, such as a light-emitting device, for example. The method preferably includes providing a (1$\bar{1}$00)-oriented, single crystal AlGaN layer being devoid of carbon and having a defect density of less than about $10^7$ cm$^{-2}$; forming at least one doped semiconductor layer adjacent the (1$\bar{1}$00)-oriented, single crystal AlGaN layer; and forming at least one contact to the at least one doped semiconductor layer. A major surface of the (1$\bar{1}$00)-oriented, single crystal AlGaN layer may have a surface roughness of less than about 5 nm RMS. The (1$\bar{1}$00)-oriented, single crystal AlGaN layer may also have a thickness of greater than about 100 microns.

Still another aspect of the invention relates to an electronic device, such as a light-emitting device, for example. The electronic device preferably includes a (1$\bar{1}$00)-oriented, single crystal AlGaN layer being devoid of carbon throughout and having a defect density of less than about $10^7$ cm$^{-2}$; at least one doped semiconductor layer adjacent the (1$\bar{1}$00)-oriented, single crystal AlGaN layer; and at least one contact to the at least one doped semiconductor layer.

BRIEF DESCRIPTION OF THE DRAWINGS

FIG. 5 is a schematic cross-sectional view of the free-standing, single crystal AlGaN wafer after the LiAlO$_2$ substrate is removed.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The appearance of regions and layers is not to scale and may be exaggerated for clarity of explanation.

Referring to FIGS. 1-7 a method for making free-standing, low defect density AlGaN wafers according to the present invention is described. FIGS. 1-6 illustrate intermediate structures during manufacture, while the flow chart of FIG. 7 sets forth the corresponding process steps. Accordingly, reference will be made to both the intermediate structures and the method steps in the following description for clarity.

From the start (Block 42), an LiAlO$_2$ substrate 20 (FIG. 1) is provided, and the substrate may be cleaned at Block 44. After cleaning, the LiAlO$_2$ substrate 20 is placed in a deposition reactor that provides the controlled conditions for growth of the AlGaN layer 24.

Figure 1:
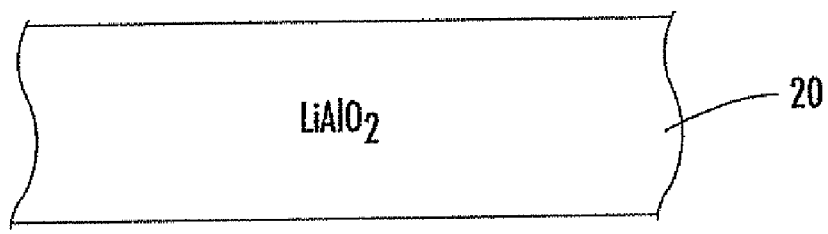
FIGS. 1 through 3 are schematic cross-sectional views illustrating forming of an AlGaN layer on an LiAlO$_2$ substrate in accordance with the present invention.
Figure 2:
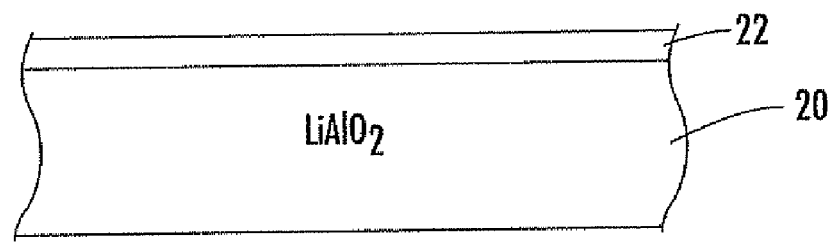

At Block 46, the substrate 20 may be pretreated to form a gallium monolayer 22 thereon as shown in FIG. 2. It is theorized by applicants, without their wishing to be bound thereto, that the monolayer 22 comprises Ga as well as a halide, and that this monolayer improves the subsequent growth of AlGaN. It is believed that the halide is substantially removed during the subsequent deposition step. The pretreating (Block 46) may use a gallium halide reactant gas, such as GaCl, without the nitrogen-containing reactant gas, such as NH$_3$. This is in contrast to a number of prior art approaches, such as U.S. Pat. No. 6,218,280, which suggest the desirability of first nitriding the surface of the substrate. U.S. Pat. No. 6,139,628 also discloses the desirability of forming an initial growth layer of gallium nitride, which is performed at a lower temperature prior to deposition of a GaN layer.

Of course, the pretreating (Block 46) may be performed for a time sufficient to form the gallium monolayer 22 on the single crystal LiAlO$_2$ substrate 20. For example, the pretreating (Block 46) may be carried out for about 30 seconds to 2 minutes. It is also theorized that the pretreating (Block 46) may not be needed for all applications.

Figure 3:
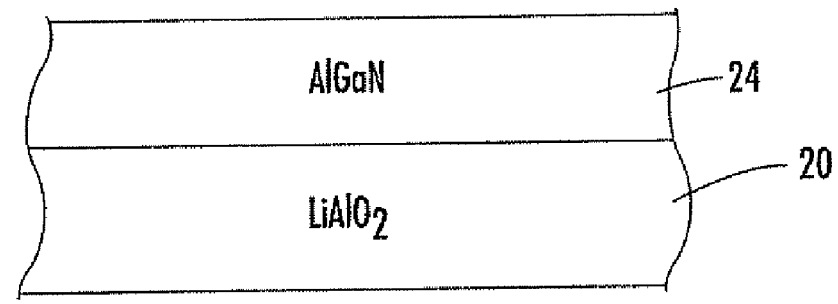
Figure 4:
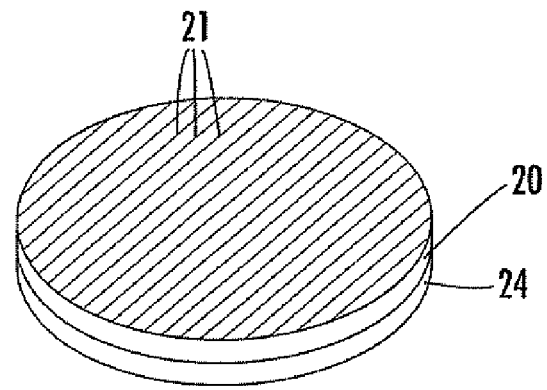
FIG. 4 is a schematic perspective view of the intermediate AlGaN product as shown in FIG. 4, with the LiAlO$_2$ substrate being shown on top.
Figure 7:
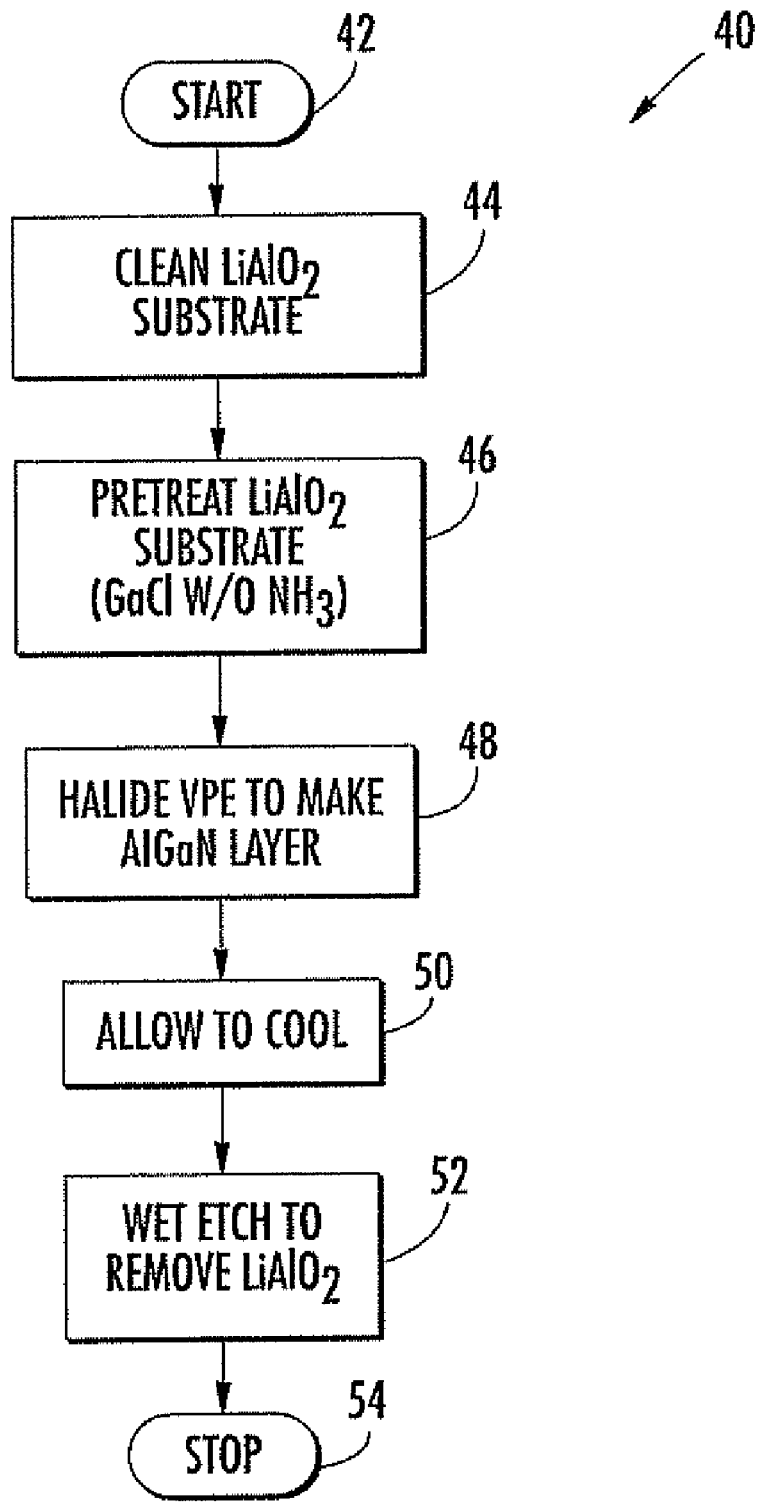
FIG. 7 is a flow chart of the steps for making the free-standing AlGaN wafer in accordance with the invention.

As shown in FIG. 3 and indicated at Block 48 of the flow chart 40 of FIG. 7, the AlGaN layer 24 may be grown on the pretreated substrate 20. This growth may be conveniently carried out in the same deposition reactor as was the pretreating. The deposition reactor may be designed for growing AlGaN by halide vapor phase epitaxy, with a main tube made of quartz and two vapor geneation tubes included therein to carry, respectively, a gallium halide (e.g., GaCl) and an aluminum halide (e.g., AlCl). Because an aluminum halide tends to etch quartz, the tube that carries the aluminum halide may comprise alumina to prevent corrosion. So, too, all exposed quartz surfaces in the deposition reactor may be pre-coated with a thin film of GaN prior to growth using a volatile aluminum halide.

The single crystal AlGaN layer 24 may be deposited by vapor phase epitaxy (VPE) using a reactant gas of gallium halide, a reactant gas of aluminum halide, and a nitrogen-containing reactant gas. The optional pretreating (Block 46) and depositing by halide VPE (Block 48) may be considered as forming the single crystal AlGaN layer 24.

The gallium halide reactant gas may comprise gallium chloride, for example. The aluminum halide reactant gas, for example, may comprise aluminum chloride. The nitrogen-containing reactant gas may comprise ammonia, for example. Other aluminum and gallium halide gasses may be used as will be appreciated by those skilled in the art. In addition, nitrogen-containing gases other than $NH_3$ may also be used, although $NH_3$ is preferred for most applications. Both the pretreatment (Block 46) and halide VPE (Block 48) may be carried out at a temperature in a range of about 800 to 1100° C., and at a pressure in a range of about 100 to 300 Torr.

Using chlorides, the halide VPE deposition (Block 48) is based on a chemical equilibrium within the heated walls of the deposition reactor involving the following reactions:

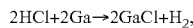

and,

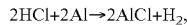

At Block 50, the $LiAlO_2$ substrate 20 and AlGaN layer 24 are allowed to cool. Because the $LiAlO_2$ substrate is compliant, it does not bow as the AlGaN forms, as typically occurs when using, for example, a conventional sapphire substrate. In addition, the $LiAlO_2$ substrate 20 will relieve stress due to the difference in thermal expansion coefficients by forming cracks, schematically illustrated by lines 21 in FIG. 4.

Figure 5:
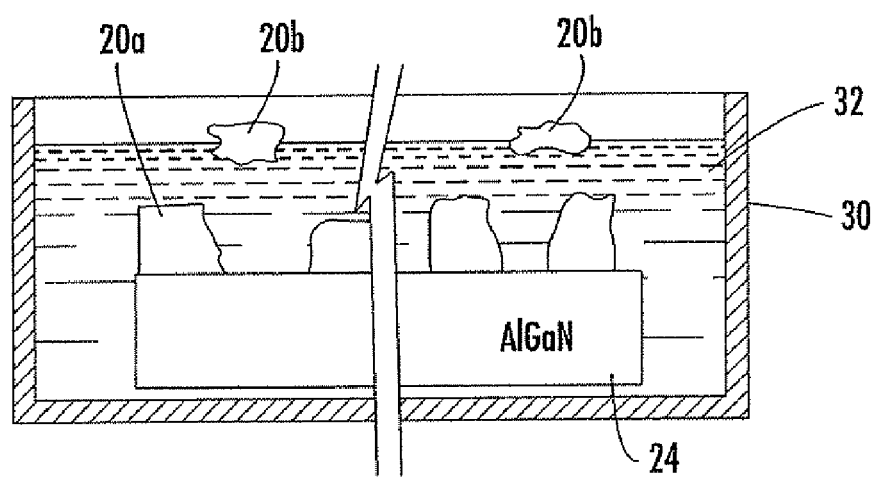
FIG. 5 is a schematic cross-sectional view of the intermediate AlGaN product illustrating wet etching of the LiAlO$_2$ substrate.
Figure 6:
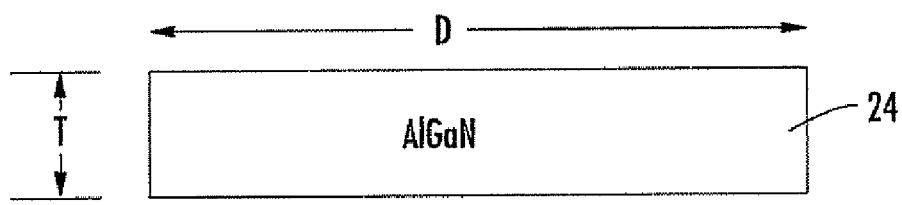

As shown in FIG. 5, the $LiAlO_2$ substrate 20 and AlGaN layer 24 may be wet etched (Block 52) to remove the substrate and leave the free-standing single crystal AlGaN layer 24 as shown in FIG. 6. As schematically shown in FIG. 5, the AlGaN layer 24 and $LiAlO_2$ substrate 20 may be placed in an etchant 32, such as hydrochloric acid, in a suitable container. To increase the etch rate, the etchant 32 may be heated as will be appreciated by those skilled in the art. As shown in FIG. 5, during etching, some of the substrate portions 20b may separate first, leaving other substrate portions 20a still attached to the AlGaN layer 24. However, the substrate portions 20a will also be removed over time before stopping at Block 54, and leaving only the AlGaN layer 24 to thereby produce the free-standing, single crystal AlGaN wafer as shown in FIG. 6.

The single crystal AlGaN wafer 24 may advantageously be (1$\bar{1}$00)-oriented, single crystal AlGaN based upon growth using (100)-oriented tetragonal (γ) $LiAlO_2$ as the starting substrate 20. Those skilled in the art will appreciate that the term "(1$\bar{1}$00)-oriented" is the same as (10$\bar{1}$0), ($\bar{1}$100), ($\bar{1}$010), (01$\bar{1}$0), or (0$\bar{1}$10)-oriented in view of the hexagonal crystalline structure of the AlGaN. For simplicity and clarity of explanation, only the designation (1$\bar{1}$00)-oriented is used elsewhere herein. Such a (1$\bar{1}$00)-oriented AlGaN wafer 24 offers advantages in terms of efficiency and producing UV spectrum light emitting devices as will be appreciated by those skilled in the art.

One aspect of the invention is thus directed to a method for making the free-standing, single crystal, AlGaN wafer 24 comprising forming a single crystal AlGaN layer 24 directly on a single crystal $LiAlO_2$ substrate 20 using both an aluminum halide reactant gas and a gallium halide reactant gas, and removing the single crystal $LiAlO_2$ substrate from the single crystal AlGaN layer. Because gallium halide is used as a reactant gas rather than a metal organic reactant such as trimethygallium (TMG), the growth of the AlGaN layer 24 can be performed using VPE, which provides commercially acceptable rapid growth rates.

The AlGaN layer 24 is also devoid of carbon throughout. Also, because the AlGaN layer 24 produced is a high quality single crystal, its upper major surface opposite the $LiAlO_2$ substrate 20 is relatively smooth and does not typically need a smoothing capping layer, as typically formed using a metalorganic reactant, such as TMG. The upper major surface opposite the substrate 20 may have a surface roughness of less than about 5 nm RMS. In addition, the free-standing AlGaN wafer 24 may have a diameter (D) of greater than about 50 mm, and a thickness (T) of greater than about 100 microns.

Figure 8:
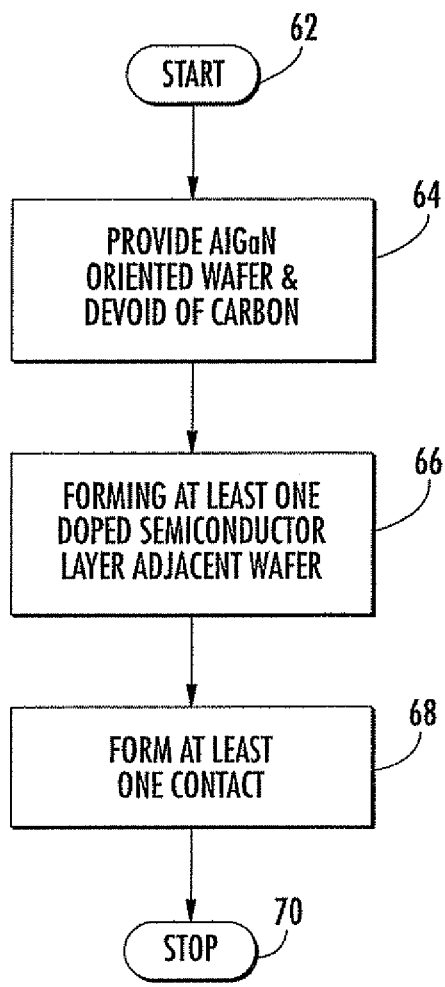
FIG. 8 is a flow chart of the steps for making an electronic device using the single crystal AlGaN wafer in accordance with the invention.
Figure 9:
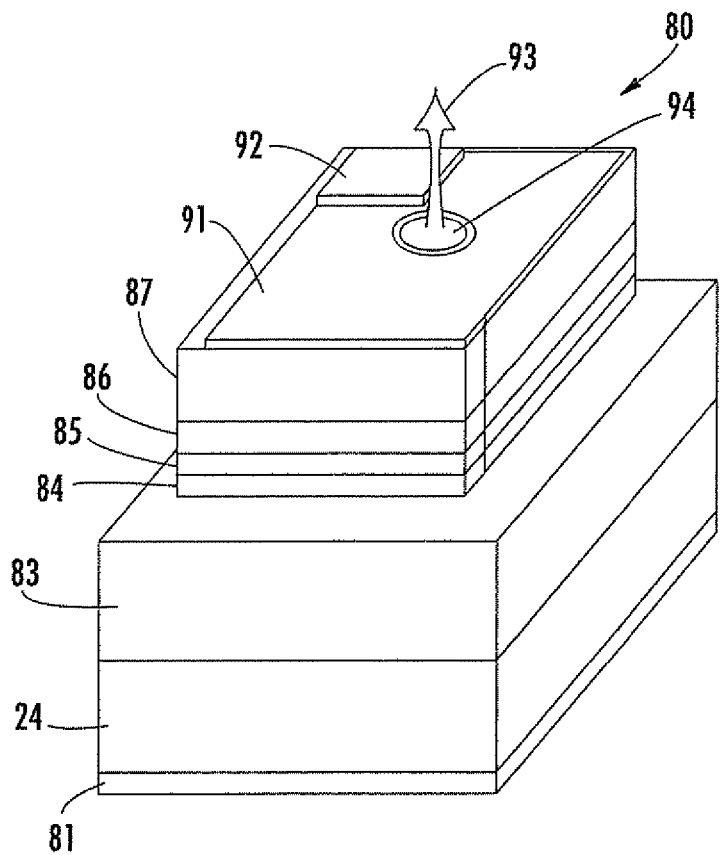
FIG. 9 is a schematic perspective view of an electronic device using the single crystal AlGaN wafer in accordance with the invention.

Turning now additionally to the flow chart 60 of FIG. 8 and the exemplary electronic device 80 of FIG. 9 other aspects of the invention are now described in further detail. In particular, the AlGaN wafer 24 as described above may be used to form electronic devices, particularly, light-emitting devices producing wavelengths in the ultraviolet region.

From the start (Block 62), the method for making such an electronic device may include providing a (1$\bar{1}$00)-oriented, single crystal AlGaN layer 24 that is devoid of carbon throughout and has a defect density of less than about $10^7$ $cm^{-2}$ (Block 64). The method also illustratively includes forming at least one doped semiconductor layer adjacent the (1$\bar{1}$00)-oriented, single crystal AlGaN layer, such as by VPE (Block 66) or other deposition techniques as will be appreciated by those skilled in the art. Thereafter, at Block 68, at least one contact may be formed to the at least one doped semiconductor layer. The at least one doped semiconductor layer may comprise a compound of AlGaInN, for example.

As described above, the upper major surface of the (1$\bar{1}$00)-oriented, single crystal AlGaN layer 24 may have a surface roughness of less than about 5 nm RMS. The (1$\bar{1}$00)-oriented, single crystal AlGaN layer 24 may also have a thickness (T) of greater than about 100 microns.

Accordingly, still another aspect of the invention relates to an electronic device, such as a light-emitting device, for example. The electronic device may be broadly considered as including the (1$\bar{1}$00)-oriented, single crystal AlGaN layer 24 being devoid of carbon throughout and having a defect density of less than about $10^7$ $cm^{-2}$; at least one doped semiconductor layer adjacent the (1$\bar{1}$00)-oriented, single crystal AlGaN layer; and at least one contact to the at least one doped semiconductor layer.

A representative light-emitting device 80 is now described with specific reference to FIG. 9. The device 80 illustratively includes an aluminum electrode layer 81 on the lower surface of the single crystal AlGaN layer 24. The aluminum electrode layer 81 may have a thickness on the order of 150 nm. On the upper surface of the AlGaN layer 24 is an n-type Si:GaN epitaxial layer 83, which may have a thickness of about 1000 nm.

Stacked on the n-type GaN layer 83 are a series of additional semiconductor layers 84-87. For example, these layers illustratively include, an Si:AlGaN n-type layer 84 of about 150 nm thickness, an InGaN active layer 85 of about 50 nm, an Mg:AlGaN p-type layer 86 of about 150 nm, and an Mg:GaN p-type layer 87 of about 500 nm. An Ni—Au contact layer 91 is illustratively on the semiconductor layer stack 84-87. A p-electrode bonding pad 92 is provided on the Ni—Au layer 91. An opening 94 through the Ni—Au layer 91 permits light 93 to be emitted from the device 80 as will be appreciated by those skilled in the art.

As will also be appreciated by those skilled in the art, other electronic devices, including those that emit light and those that do not, may also beneficially be made using the AlGaN wafer 24 as described herein.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and other embodiments are intended to be included within the scope of the dependent claims.

That which is claimed is:

1. A free-standing wafer comprising ($1\bar{1}00$)-oriented, single crystal aluminum gallium nitride (AlGaN) being devoid of carbon throughout and having a defect density of less than about $10^7$ cm$^{-2}$.

2. A free-standing wafer according to claim 1 wherein at least one major surface thereof has an RMS surface roughness of less than about 5 nm.

3. A freestanding wafer according to claim 1 having a diameter of greater than about 50 mm.

4. A free-standing wafer according to claim 1 having a thickness of greater than about 100 microns.

5. A freestanding wafer comprising ($1\bar{1}00$)-oriented, single crystal aluminum gallium nitride (AlGaN) being devoid of carbon throughout and having a defect density of less than about $10^7$ cm$^{-2}$ and a thickness greater than about 100 microns, and a diameter of greater than about 50 mm.

6. A free-standing wafer according to claim 5 wherein at least one major surface thereof has an RMS surface roughness of less than about 5 nm.

\* \* \* \* \*